United States Patent
Reinberg

(12) 
(10) Patent No.: US 6,479,379 B2
(45) Date of Patent: *Nov. 12, 2002

(54) SELF-ALIGNED ETCH STOP FOR POLYCRYSTALLINE SILICON PLUGS ON A SEMICONDUCTOR DEVICE

(75) Inventor: Alan Reinberg, Westport, CT (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/954,605

(22) Filed: Sep. 10, 2001

(65) Prior Publication Data

US 2002/0019126 A1 Feb. 14, 2002

Related U.S. Application Data

(63) Continuation of application No. 09/325,317, filed on Jun. 3, 1999, now Pat. No. 6,287,958.

(51) Int. Cl.[7] .......................................... H01L 21/4763
(52) U.S. Cl. ...................... 438/635; 438/585; 438/592
(58) Field of Search ................. 438/636–641, 438/672–675, 688, 585, 592

(56) References Cited

U.S. PATENT DOCUMENTS 5,346,836 A   9/1994  Manning et al.
6,080,646 A * 6/2000 Wang ........................ 438/585
6,100,173 A * 8/2000 Gardener et al. ........... 438/592

OTHER PUBLICATIONS

"A Margin–Free Contact Process Sing AN A1203 Etch–Stop Layer for High Density Devices" T. Fukase, H. Hada, H. Aoki, and T. Kunio, Microelectronics Research Laboratories, NEC Corporation, 1992 IEEE, IEDM 92–837–840.

"A Novel Borderless Contact/Interconnect Technology Using Aluminum Oxide Etch Stop for High Performance SRAM and Logic" S. Subbanna et al., IBM Semiconductor Research and Development Center, Yorktown Hts., NY 1993 IEEE, IEDM 93–441–444.

"Novel High Aspect Ratio Aluminum Plug . . . ",Hiroshi Hori et al., IEDM, 1996, pp. 946–948.

* cited by examiner

Primary Examiner—David Nelms
Assistant Examiner—Dung Anh Le

(57) ABSTRACT

A method for providing a self-aligned etch stop layer comprises the steps of providing a dielectric layer having a polycrystalline silicon (poly) plug formed therein. An aluminum layer is formed to contact the dielectric layer and the plug, then the structure is heated. Heating the aluminum and the poly results in the absorption of the aluminum overlying the plug into the poly, while the aluminum overlying the dielectric is not absorbed. The aluminum over the dielectric is oxidized which forms a self-aligned etch stop layer. Layers are formed over the aluminum oxide and are subsequently etched. The etch stops on the aluminum oxide and the poly plug.

20 Claims, 3 Drawing Sheets

SELF-ALIGNED ETCH STOP FOR POLYCRYSTALLINE SILICON PLUGS ON A SEMICONDUCTOR DEVICE

This is a continuation of U.S. application Ser. No. 09/325,317 filed Jun. 3, 1999 and issued Sep. 11, 2001 as U.S. Pat. No. 6,287,958.

FIELD OF THE INVENTION

This invention relates to the field of semiconductor manufacture, and more particularly to a method for forming a self-aligned etch stop layer.

BACKGROUND OF THE INVENTION

Semiconductor devices, including static and dynamic random access memories, microprocessors, logic devices, etc., commonly comprise polycrystalline silicon (poly) plugs or studs used as contacts. For example, poly plugs can be used to contact two levels of metal or as contacts for structures such as capacitors in dynamic random access memories (DRAMs).

To construct a structure comprising a poly plug, a conductive layer which the plug will contact is formed, then a first dielectric layer is deposited, masked, and etched to form a contact hole therein. A blanket poly layer is formed which fills the hole, then the poly layer is planarized such that poly is removed from horizontal surfaces but remains in the hole. Subsequently, a second dielectric layer is deposited and a mask is aligned such that an etch of the second dielectric layer will expose the poly plug. The second dielectric layer is often slightly over-etched to facilitate complete removal of the dielectric material from the contact to ensure the plug is exposed. A metal layer is formed by sputtering or chemical vapor deposition to fill the hole in the second dielectric layer and to contact the poly plug in the first dielectric layer.

With decreasing semiconductor device feature sizes it becomes increasingly difficult to accurately align the mask over the second dielectric layer with the poly plug so that the etched hole in the second dielectric layer strikes only the poly plug. Misaligning the mask results in the exposure and etching of the first dielectric layer during the etch of the second dielectric layer. Consequently, there is a high likelihood that a portion of the first dielectric material in the proximity of the plug will be etched, as this material is often similar to the material being etched above the plug. When a subsequent conductive layer is formed within the hole in the second dielectric layer, the material will fill the area around the plug. This can result in electrical shorting or altered electrical characteristics of the completed device.

An aluminum oxide etch stop layer has been proposed which reduces undesirable dielectric etches when forming contact holes to underlying layers. In such a process, a blanket aluminum layer is formed over the region to which contact is to be made and over a desirable dielectric layer such as a cap and a sidewall over a conductive line. The aluminum is oxidized, then a second dielectric layer is formed over the aluminum oxide and a patterned photoresist layer is formed over the second dielectric layer. The second dielectric layer is etched using the aluminum oxide as an etch stop. A second etch is performed which etches the aluminum oxide and stops on the first dielectric layer. This process, however, has the disadvantage that processes which etch aluminum oxide also etch poly. Thus, the aluminum oxide etch must be timed to prevent etching of the poly as the oxide is cleared from the plug. Timed etches lend themselves to under-etching, which can result in electrical opens, or to over-etching, which can result in shorting or forming structures with undesirable electrical properties.

A method for forming a structure such as the one above, or similar structures, which reduces or eliminates the stated problems would be desirable.

SUMMARY OF THE INVENTION

The present invention provides a new method that reduces problems associated with the manufacture of semiconductor devices, particularly problems resulting in the undesirable etching of material surrounding a feature such as a polycrystalline silicon plug. In accordance with one embodiment of the invention, a first dielectric layer having a silicon plug therein, such as a polycrystalline silicon plug, is formed such that the plug is electrically coupled with an underlying conductive layer. An oxidizable layer, for example aluminum, is blanket deposited over the plug and over the first dielectric layer. The assembly is annealed or otherwise processed to diffuse the aluminum in contact with the plug into the poly, thereby effectively removing the aluminum from the surface of the plug.

Subsequently, the aluminum layer is oxidized. If any aluminum remains on the surface of the plug and is oxidized during this oxidation, a brief etch can be performed. Any oxide which forms on the plug will be much thinner than the oxidized aluminum over the dielectric surface and can be quickly removed with minimal thinning of the aluminum oxide overlying the first dielectric layer.

Next, a second dielectric layer is formed over the plug and over the aluminum oxide layer. A patterned photoresist layer is formed over the second dielectric layer with openings over the plug region, and an etch is performed to remove the exposed second dielectric layer. The etch chemistry is such that it removes the second dielectric layer selective to aluminum oxide and poly. When the etch removes all the exposed portions of the second dielectric layer the plug and the aluminum oxide are exposed and etching stops.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENTS

Figure 1:
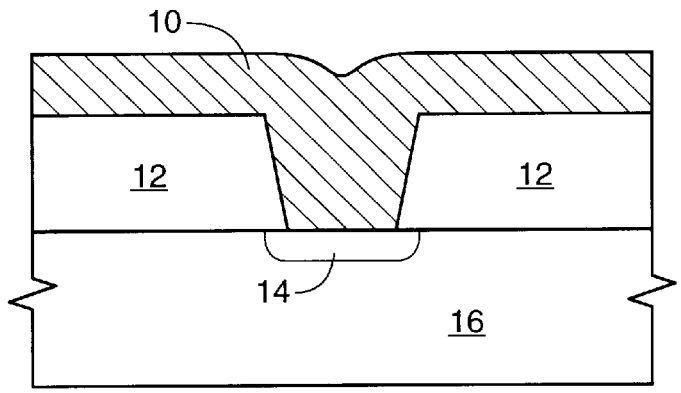
FIG. 1 is a cross section depicting a starting structure for forming a polycrystalline silicon (poly) plug within a first dielectric layer.

An embodiment of an inventive method for forming a self-aligned etch stop layer and an opening to a silicon layer, for example a polycrystalline silicon (poly) layer, is depicted in FIGS. 1–6. While the invention is described with reference to a poly plug, other silicon plugs such as a plug formed from an epitaxial silicon layer may also be useful. FIG. 1 depicts a conductive blanket poly layer 10 formed over a first dielectric layer 12, for example borophosphosilicate glass (BPSG), tetraethyl orthosilicate (TEOS) or silicon nitride, and within a hole in the first dielectric layer. To provide adequate conductivity, the poly layer can be heavily doped with an n-type or p-type dopant, depending on its use. The poly is electrically coupled with a conductively doped region 14 within a semiconductor wafer substrate assembly 16. Contact to the doped region 14 is for purposes of illustration only, as it will be appreciated that electrical coupling can be facilitated between the plug and various silicon, metal, and other conductive structures. A poly layer having a thickness of from about 200 angstroms (Å) to about 7,000 Å, a first dielectric layer having a thickness of about 10,000 Å, and a contact hole having a width of about 2,000 Å would be sufficient and can be formed according to means known in the art.

Figure 2:
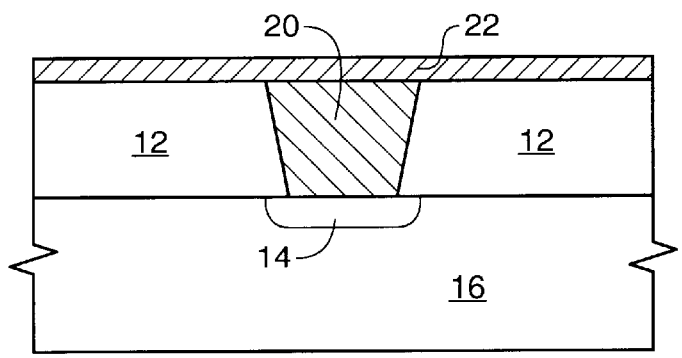
FIG. 2 is a cross section of the FIG. 1 structure after planarizing the poly layer to form the plug and a subsequent formation of an aluminum layer.

The poly layer 10 is planarized, for example using a chemical mechanical polishing process, to result in the plug 20 of FIG. 2. Subsequently, an oxidizable layer 22 such as a blanket aluminum layer is formed over the poly and the dielectric. Other metal layers, for example a magnesium layer or a zinc layer processed in accordance with manufacturing steps described herein for aluminum, may also be sufficient. An aluminum layer between about 45 Å and about 55 Å thick, and preferably about 50 Å thick, would be sufficient. An aluminum layer can be formed by means well known in the art. For example, a sputtered layer about 50 Å thick can be formed using conventional sputtering equipment at a power of 500 watts for about six seconds.

Figure 3:
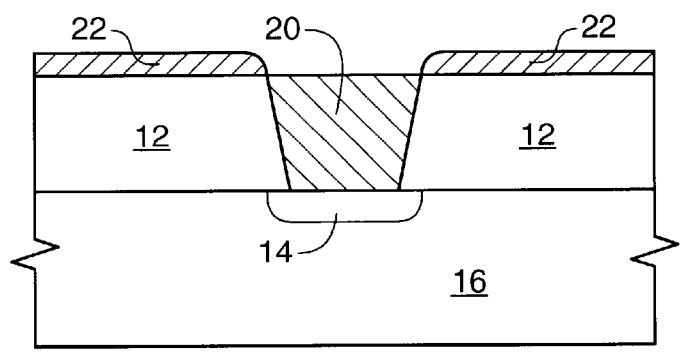
FIG. 3 depicts the FIG. 2 structure after an anneal step.

Next, the structure of FIG. 2 is processed to diffuse the aluminum 22 which overlies and contacts the poly plug 20 into the poly 20 to result in the structure of FIG. 3. This can be accomplished with an anneal step, for example by subjecting the structure to a temperature of between about 400° C. and about 500° C., for example about 400° C., for between about 30 seconds and about five minutes, preferably for about two minutes. The aluminum which contacts the poly is thereby diffused or absorbed into the poly. At most, only a minimal number of aluminum atoms will remain on the surface of the poly while the aluminum over the dielectric remains substantially unaltered as depicted in FIG. 3.

Figure 4:
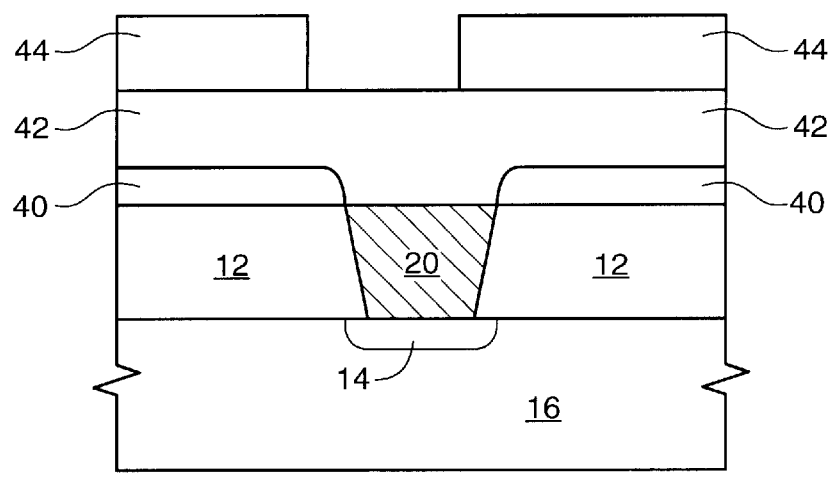
FIG. 4 is a cross section depicting the FIG. 3 structure after oxidation of the remaining aluminum and formation of a second dielectric layer and a misaligned photoresist layer.

After diffusing the aluminum into the poly the remaining aluminum is oxidized to result in the aluminum oxide layer 40 as depicted in FIG. 4. For example, the aluminum can be exposed to an oxidizing atmosphere comprising oxygen ($O_2$) at a temperature of between about 250° C. and about 400° C. for between about 60 seconds and about five minutes for the 50 Å layer described above. This is sufficient to fully covert the aluminum to aluminum oxide.

If necessary, any aluminum on the surface of the poly plug which oxidizes can be removed with an etch of $BCl_3$ for between about five seconds and about 30 seconds. This will remove any aluminum oxide over the poly without excessive removal of the aluminum oxide overlying the first dielectric layer. It may be possible to perform this etch during an etch of an overlying oxide layer.

Next, an overlying oxide layer 42, for example BPSG or TEOS, is deposited and planarized to result in a layer of between about 2,000 Å and about 20,000 Å thick. A patterned photoresist 44 is formed to expose the aluminum oxide in the region where contact is to be made to the poly plug 20. An oxide etch, for example, a dry etch using $CF_4$, $CHF_3$ and, argon in a high density etcher will etch the overlying oxide layer 42 at a rate of about 8,000 Å/min and stop on (or in) the aluminum oxide etch stop layer 40 and the poly plug 20. If necessary, any oxide layer overlying the plug, for example an oxide layer formed during oxidation of the aluminum layer, can be performed after the etch stop layer is exposed to expose the plug.

Figure 5:
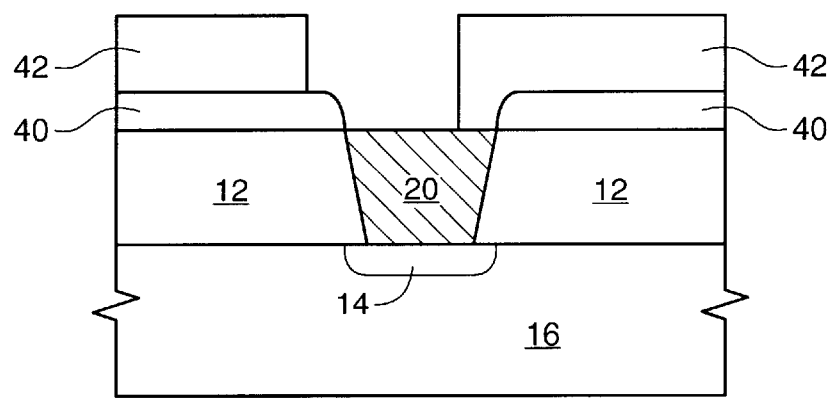
FIG. 5 depicts the FIG. 4 structure after etching the second dielectric layer to form a contact opening to the poly plug.
Figure 6:
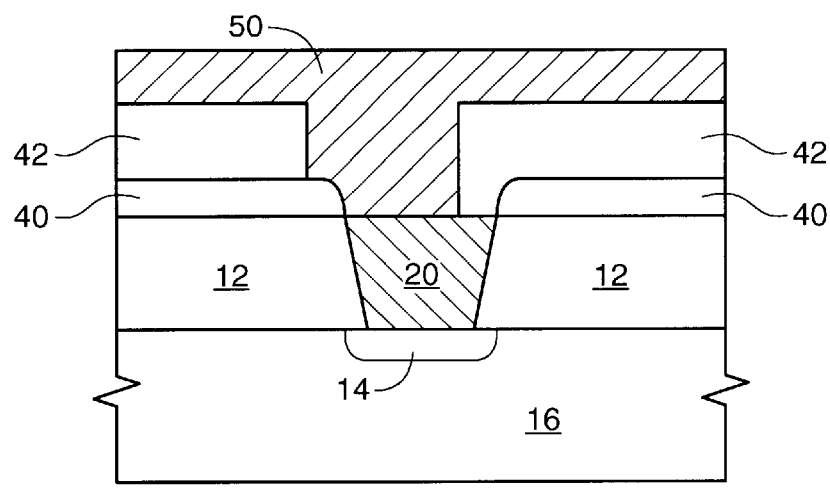
FIG. 6 depicts the structure of FIG. 5 after forming a conductive layer contacting the poly plug.

The photoresist layer 44 is removed after the etch of the overlying dielectric 42 to result in the structure of FIG. 5. A conductive layer 50 is formed within the opening in the overlying dielectric layer 42 as depicted in FIG. 6. Wafer processing continues to form a semiconductor device according to means known in the art.

Figure 7:
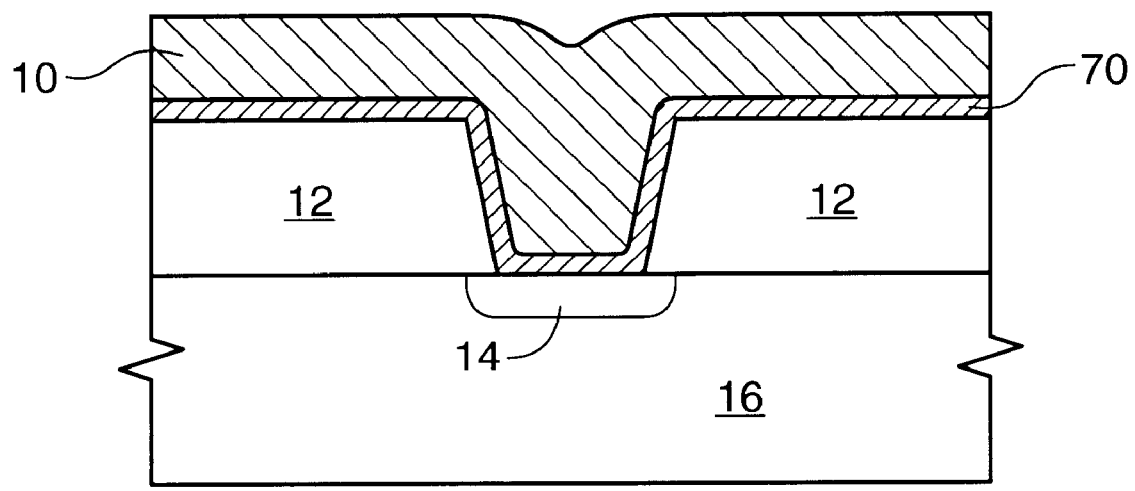
FIG. 7 is a cross section of one embodiment of the invention comprising the use of a barrier layer.

In an alternate embodiment, a dielectric layer 12 having an opening to a region 14 to which contact is to be made is formed over a substrate assembly 16 as described with FIG. 1. A barrier layer 70 is then formed over the dielectric 12 and contacts region 14 as depicted in FIG. 7. A blanket layer of conductive plug material 10 is then formed over the barrier 70. Wafer processing continues in a process similar to that described for FIGS. 1–6. In this embodiment, the barrier layer 70 separates the poly layer 10 from the structure 14 to which contact is to be made. The barrier layer reduces or eliminates aluminum atoms from diffusing through the poly into the underlying layer. This is a concern especially when the underlying layer is a doped region in a silicon substrate or another silicon structure. A barrier layer of titanium nitride can be formed using chemical vapor deposition (CVD), for example using $TiCl_3$ and $NH_3$ as precursors according to means known in the art. Other refractory metal nitrides may also be sufficient. The poly plug formed after an etch of the poly 10 of FIG. 7 is electrically coupled with structure 14 but does not contact structure 14.

The instant invention uses the plug material to absorb the metal which overlies and contacts the plug. The remaining metal is then oxidized to form the etch stop layer. The etch stop layer is self-aligned as no patterned photoresist layer is necessary for its formation.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method used to form a semiconductor device, comprising:

providing a conductive feature;

forming a dielectric layer comprising an upper surface, said dielectric layer having an opening therein which exposes said conductive feature;

forming a conductive layer within said opening to contact said conductive feature, wherein said conductive layer comprises an upper surface;

forming an oxidizable layer over said upper surface of said dielectric layer and over said upper surface of said conductive layer;

processing said oxidizable layer such that said oxidizable layer over said upper surface of said conductive layer is absorbed into said conductive layer and said oxidizable layer over said upper surface of said dielectric layer is not absorbed into said dielectric layer; and subsequent to processing said oxidizable layer, oxidizing said oxidizable layer.

2. The method of claim 1 wherein said formation of said conductive layer further comprises:

forming a first conformal conductive barrier layer within said opening which only partially fills said opening and comprises a portion overlying said dielectric layer;

forming a second conformal conductive layer within said opening which fills said opening and comprises a portion overlying said dielectric layer; and removing said portions of said first and second conformal conductive layers which overlie said dielectric layer.

3. The method of claim 2 further comprising:

forming a titanium nitride layer during said formation of said barrier layer; and forming a polycrystalline silicon layer during said formation of said second conformal conductive layer.

4. The method of claim 1 further comprising forming a polycrystalline silicon layer during said formation of said conductive layer within said opening.

5. The method of claim 1 further comprising:

oxidizing a portion of said oxidizable layer which is absorbed into said conductive layer during said oxidizing said oxidizable layer; then etching said oxidized portion of said oxidizable layer which is absorbed into said conductive layer.

6. A method for forming a semiconductor device, comprising:

forming a first dielectric layer having an opening therein;

forming a feature comprising silicon within said opening;

forming a diffusion layer over said dielectric layer and over said feature;

processing said diffusion layer such that at least a majority of said diffusion layer over said feature is diffused into said feature and such that said diffusion layer over said dielectric layer is not diffused into said dielectric layer, wherein said diffusion forms a pattern in said diffusion layer;

subsequent to processing said diffusion layer, forming a second dielectric layer over said diffusion layer; and etching said second dielectric layer to expose said feature, wherein said diffusion layer functions as an etch stop layer during said etching.

7. The method of claim 6 further comprising oxidizing said diffusion layer subsequent to said diffusion of said diffusion layer into said feature and prior to said formation of said second dielectric layer.

8. The method of claim 6 further comprising forming a barrier layer within said opening prior to forming said feature comprising silicon within said opening.

9. The method of claim 6 further comprising forming a refractory metal nitride layer within said opening prior to forming said feature comprising silicon within said opening.

10. The method of claim 8 further comprising:

forming an opening in said second dielectric layer during said etching of said second dielectric layer; and forming a conductive layer within said opening in said second dielectric layer, wherein said conductive layer in said second dielectric layer is electrically coupled with said feature comprising silicon.

11. A method used to form a semiconductor device comprising:

providing a semiconductor wafer assembly comprising a conductive structure;

forming a first dielectric layer over said semiconductor wafer assembly;

etching said first dielectric layer to form an opening therein which exposes said conductive structure;

forming a blanket silicon layer within said opening and over an upper surface of said first dielectric layer, wherein said blanket silicon layer is electrically coupled with said conductive structure;

planarizing said blanket silicon layer to remove said silicon layer from said upper surface of said first dielectric layer to form a conductive plug within said opening in said first dielectric layer which contacts said conductive structure;

forming an oxidizable layer comprising a material selected from the group consisting of aluminum, magnesium, and zinc over said upper surface of said first dielectric layer and over said conductive plug;

annealing said oxidizable layer to diffuse said material over said conductive plug into said conductive plug wherein, subsequent to said annealing, at least a majority of said oxidizable layer remains over said first dialectic layer;

subsequent to said annealing, oxidizing said oxidizable layer which remains over said first dielectric layer;

forming a second dielectric layer over said oxidized layer;

etching said second dielectric layer to form an opening therein and to expose said conductive plug, wherein said oxidized layer functions as an etch stop layer during said etching of said second dielectric layer; and forming a conductive layer within said opening in said second dielectric layer which contacts said conductive plug.

12. The method of claim 11 further comprising:

during said oxidizing of said oxidizable layer which remains over said first dielectric layer, oxidizing a portion of said material diffused into said conductive plug to form an oxidized layer over said plug; and subsequent to oxidizing said material and prior to forming said conductive layer within said opening in said second dielectric layer, etching said oxidized layer from over said plug.

13. The method of claim 12 further comprising exposing said oxidized layer over said plug to $BCl_3$ for between about five second and about 30 seconds during said etching of said oxidized layer from over said plug.

14. The method of claim 11 further comprising forming an oxidizable layer having a thickness of between about 45 Å and about 55 Å and comprising aluminum during said forming of said oxidizable layer.

15. The method of claim 11 further comprising heating said oxidizable layer to a temperature of between about 400° C. and about 500° C. for between about 30 seconds and about five minutes during said annealing of said oxidizable layer.

16. The method of claim 11 further comprising exposing said oxidizable layer to an atmosphere comprising oxygen at a temperature of between about 250° C. and about 400° C. for between about 60 seconds and about five minutes during said oxidizing of said oxidizable layer.

17. The method of claim 11 further comprising physically contacting said blanket silicon layer and said conductive structure during said formation of said blanket silicon layer.

18. The method of claim 11 further comprising forming a barrier layer subsequent to etching said first dielectric layer to form said opening therein and prior to forming said blanket silicon layer, which said blanket silicon layer is electrically coupled to said conductive structure through said barrier layer.

19. The method of claim 18 further comprising forming a refractory metal nitride layer during said formation of said barrier layer.

20. The method of claim 18 further comprising forming a titanium nitride layer during said formation of said barrier layer.

* * * * *